US012604419B2

(12) United States Patent (10) Patent No.: US 12,604,419 B2
Maut et al. (45) Date of Patent: Apr. 14, 2026

(54) BARRIER LAYER FOR AN ELECTRICAL DEVICE

(71) Applicant: HONEYWELL INTERNATIONAL INC., Charlotte, NC (US)

(72) Inventors: Sandeep Laxman Maut, Charlotte, NC (US); Nikhil Pokkandath Swaminadhan, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 205 days.

(21) Appl. No.: 18/585,498

(22) Filed: Feb. 23, 2024

(65) Prior Publication Data

US 2024/0306309 A1      Sep. 12, 2024

(30) Foreign Application Priority Data

Mar. 9, 2023      (IN) .............................. 202311015683

(51) Int. Cl.
H05K 1/18          (2006.01)
H05K 1/02          (2006.01)
H05K 3/28          (2006.01)
(52) U.S. Cl.
CPC ........... H05K 3/284 (2013.01); H05K 1/0274 (2013.01); H05K 1/18 (2013.01); H05K 2201/10151 (2013.01); H05K 2203/1366 (2013.01)
(58) Field of Classification Search
CPC ........ H05K 3/284; H05K 1/0274; H05K 1/18; H05K 2201/10151; H05K 2203/1366
USPC .......................................................... 361/748
See application file for complete search history.

(56) References Cited

U.S. PATENT DOCUMENTS

| | | | |
|---|---|---|---|
| 5,623,048 A | 4/1997 | Fels | |
| 6,017,983 A | 1/2000 | Gilleo | |
| 8,212,351 B1* | 7/2012 | Debar | ..................... H01L 21/56 257/787 |
| 2008/0242768 A1 | 10/2008 | Nishihata | |
| 2015/0334846 A1* | 11/2015 | Suemori | ............. H01L 23/3135 174/251 |
| 2018/0317318 A1 | 11/2018 | Yamada et al. | |

(Continued)

FOREIGN PATENT DOCUMENTS

| | | |
|---|---|---|
| CN | 105067186 A | 11/2015 |
| CN | 205003304 U | 1/2016 |

(Continued)

OTHER PUBLICATIONS

Extended European Search Report Mailed on Aug. 6, 2024 for EP Application No. 24158484, 9 page(s).

(Continued)

*Primary Examiner* — Binh B Tran
(74) *Attorney, Agent, or Firm* — Alston & Bird LLP

(57)          ABSTRACT

An electrical device including an electrical assembly and a barrier layer. The electrical assembly includes a substrate and an electrical component that is coupled to the substrate. The electrical component is positioned between the substrate and the barrier layer. The barrier layer includes a first layer that includes a first epoxy and a second layer that includes a second epoxy that is different than the first epoxy. The first layer is positioned between the electrical component and the second layer. The second epoxy includes an amber resin.

20 Claims, 1 Drawing Sheet

(56) References Cited

U.S. PATENT DOCUMENTS

2021/0183647 A1* 6/2021 Hanft .................... H01L 23/315

FOREIGN PATENT DOCUMENTS

JP 05-249057 A 9/1993
WO 2006/017484 A1 2/2006

OTHER PUBLICATIONS

Formlabs, "BioMed Amber Resin", retrieved from the Internet at https://formlabs.com/store/materials/biomed-amber-resin/ on Sep. 18, 2024, 5 pages.
Formlabs, "BioMed Black Resin", retrieved from the Internet at https://formlabs.com/store/materials/biomed-black-resin/ on Sep. 18, 2024, 5 pages.
Formlabs, "BioMed Clear Resin", retrieved from the Internet at https://formlabs.com/store/materials/biomed-clear-resin/ on Sep. 18, 2024, 5 pages.
Formlabs, "BioMed White Resin", retrieved from the Internet at https://formlabs.com/store/materials/biomed-white-resin/ on Sep. 18, 2024, 5 pages.

* cited by examiner

BARRIER LAYER FOR AN ELECTRICAL DEVICE

CROSS-REFERENCE TO RELATED APPLICATIONS

This application claims priority pursuant to 35 U.S.C. 119 (a) to Indian Application No. 202311015683, filed Mar. 9, 2023, which application is incorporated herein by reference in its entirety.

TECHNICAL FIELD

The present application relates generally to an electrical device that includes a barrier layer to protect an electrical assembly of the electrical device. More specifically, the present application relates to an electrical device that includes a barrier layer that has an amber resin layer to protect the electrical assembly from damage caused by light and from mechanical damage.

BACKGROUND

Epoxy coatings are traditionally provided to protect electrical assemblies from mechanical damage. However, the electrical assemblies may also experience damage caused by light, such as ultraviolet light. Traditionally used epoxy layers may not provide any protection from damage caused by light and/or may not have a tensile strength adequate enough to provide sufficient protection from mechanical damage. Therefore, a barrier layer that provides protection from light damage and protection from mechanical damage would be welcomed in the art.

The inventors have identified numerous deficiencies and problems with the existing technologies in this field including the lack of protection offered with existing technologies. Through applied effort, ingenuity, and innovation, many of these identified deficiencies and problems have been solved by developing solutions that are structured in accordance with the embodiments of the present disclosure, many examples of which are described in detail herein.

BRIEF SUMMARY

In general, embodiments of the present disclosure provided herein include an apparatuses and a method to provide for improved barrier layers for an electrical device.

In various aspects, a method for applying a barrier layer on an electrical assembly that includes an electrical component that is coupled to a substrate includes applying a first layer that includes a first epoxy on the electrical assembly. The method can include applying a second layer that includes a second epoxy that is different than the first epoxy on the first layer. The second epoxy can include an amber resin. The first epoxy can include at least one of a white resin, a black resin, or a clear resin, or a combination thereof. The first epoxy and the second epoxy can both be medical-grade epoxies.

In various examples, the method further comprises curing the first layer prior to applying the second layer. The first layer can be cured with ultraviolet (UV) light.

In various examples, applying the second layer includes spraying the second layer on the first layer. Spraying the second epoxy on the first layer can include spraying multiple layers of the second layer on the first layer. The second layer can have a thickness of at least 0.02 millimeter (mm) and up to 0.06 mm.

In various examples, the method can include curing the second layer. For example, the method can include curing the second layer with UV light, thermally, or with a reflow curing technique. The second layer can have an ultimate tensile strength of at least 55 megapascal (MPa) after the second layer is cured.

In various examples, the method can include enclosing the electrical component with the barrier layer.

In various examples, the electrical assembly includes a plurality of electrical components and a plurality of electrical connections. Each of the plurality of electrical connections can be configured to allow the flow of electrons between electrical components of the plurality of electrical components. The method can include enclosing the plurality of electrical components and the plurality of electrical connections with the barrier layer.

In various examples, the method includes applying a third layer that includes a third epoxy that is different than the second epoxy on the second layer.

In various examples, the electrical component is a sensor. The electrical assembly can be a circuit board.

In various aspects, an electrical device includes an electrical assembly and a barrier layer. The electrical assembly can include a substrate and an electrical component that is coupled to the substrate. The electrical component of the electrical assembly can be positioned between the substrate and the barrier layer. The barrier layer can include a first layer that includes a first epoxy. The barrier layer can include a second layer that includes a second epoxy that is different than the first epoxy. The first layer can be positioned between the electrical component and the second layer. The second epoxy can include an amber resin. The first epoxy can include at least one of a white resin, a black resin, or a clear resin, or a combination thereof.

In various examples, the barrier layer encloses the electrical component.

In various examples, the barrier layer includes a third layer that includes a third epoxy that is different than the second epoxy. The second layer can be positioned between the first layer and the third layer.

In various examples, the electrical assembly is a circuit board. The electrical component can be a sensor.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the present disclosure in any way. It will be appreciated that the scope of the present disclosure encompasses many potential embodiments in addition to those here summarized, some of which will be further described below. Other features, aspects, and advantages of the subject matter will become apparent from the description, the drawings, and the claims.

BRIEF DESCRIPTION OF THE DRAWINGS

Figure 1:
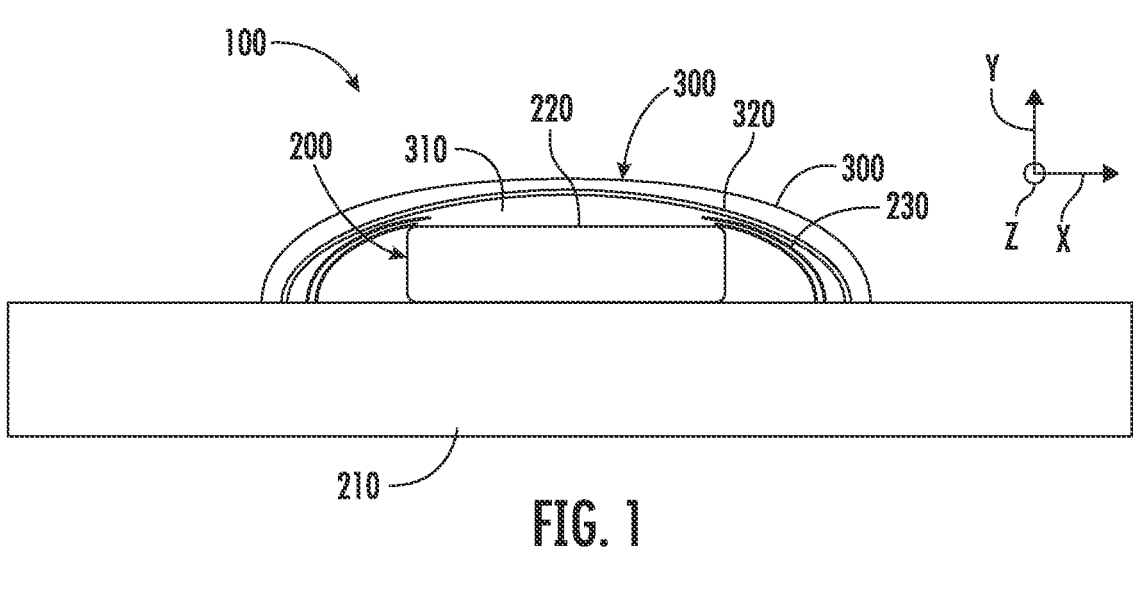

Having thus described certain example embodiments of the present disclosure in general terms above, non-limiting and non-exhaustive embodiments of the subject disclosure are described with reference to the following figures, which are not necessarily drawn to scale and wherein like reference numerals refer to like parts throughout the various views unless otherwise specified. The components illustrated in the figures may or may not be present in certain embodiments described herein. Some embodiments may include fewer (or more) components than those shown in the figures.

FIG. 1 provides a schematic, cross-sectional, side-view of an electrical device in accordance with an example embodiment.

Figure 2:
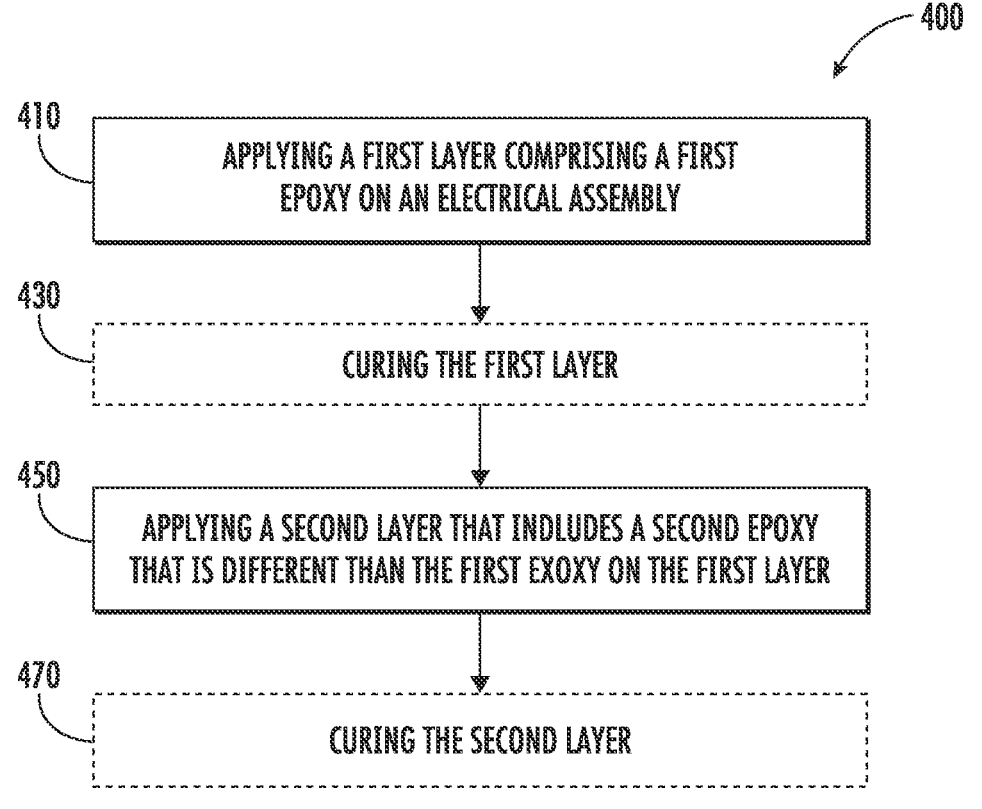

FIG. 2 provides a flowchart of a method for applying a barrier layer on an electrical assembly of the electrical device of FIG. 1, in accordance with an example embodiment.

DETAILED DESCRIPTION

One or more embodiments are now more fully described with reference to the accompanying drawings, wherein like reference numerals are used to refer to like elements throughout and in which some, but not all embodiments of the inventions are shown. In the following description, for purposes of explanation, numerous specific details are set forth in order to provide a thorough understanding of the various embodiments. It is evident, however, that the various embodiments can be practiced without these specific details. It should be understood that some, but not all embodiments are shown and described herein. Indeed, the embodiments may be embodied in many different forms, and accordingly this disclosure should not be construed as limited to the embodiments set forth herein. Rather, these embodiments are provided so that this disclosure will satisfy applicable legal requirements.

As used herein, the term "exemplary" means serving as an example, instance, or illustration. Any aspect or design described herein as "exemplary" is not necessarily to be construed as preferred or advantageous over other aspects or designs. Rather, use of the word exemplary is intended to present concepts in a concrete fashion. In addition, while a particular feature may be disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

As used herein, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, the term "electrical communication" means that an electric current and/or an electric signal are capable of making the connection between the areas specified.

As used herein, the terms "coupled," "fixed," "attached to," and the like refer to both direct coupling, fixing, or attaching, as well as indirect coupling, fixing, or attaching through one or more intermediate components or features, unless otherwise specified herein.

As used herein, the term "positioned directly on" refers to a first component being positioned on a second component such that they make contact. Similarly, as used herein, the term "positioned directly between" refers to a first component being positioned between a second component and a third component such that the first component makes contact with both the second component and the third component. In contrast, a first component that is "positioned between" a second component and a third component may or may not have contact with the second component and the third component. Additionally, a first component that is "positioned between" a second component and a third component is positioned such that there may be other intervening components between the second component and the third component other than the first component.

Referring now to FIG. 1, a schematic, cross-sectional, side-view of an electrical device 100 is provided, in accordance with an example embodiment. The electrical device 100 can define an X-direction, a Y-direction that is orthogonal to the X-direction, and a Z-direction that is orthogonal to the X-direction and the Y-direction. The electrical device 100 can include an electrical assembly 200 and a barrier layer 300. The electrical assembly 200 can include a substrate 210 and at least one electrical component 220. Each electrical component 220 can be coupled, directly or indirectly, to the substrate 210.

In various examples, the electrical assembly 200 is a circuit board, such as a printed circuit board (PCB). The substrate 210 can be a circuit board foundation that can include a non-conductive dielectric material, such as fiberglass or a polymer. The substrate 210 can extend generally along a plane defined by the X-direction and the Z-direction. Each electrical component 220 can be a battery, a capacitor, a diode, an inductor, a microchip, a resistor, a switch, a transistor, or a sensor, to name a few examples. Even though in the example of FIG. 1, only a single electrical component 220 is depicted, it should be understood that the electrical assembly 200 can include a plurality of electrical components 220. For example, when the electrical assembly 200 is a circuit board, the electrical assembly 200 can include a variety of different types of electrical components 220 (e.g., a battery, a capacitor, a diode, a sensor, etc.). The electrical assembly 200 can also include one or more electrical connections 230. The electrical connections 230 can be configured to allow the flow of electrons from one electrical component 220 to another electrical component 220.

As discussed, the electrical device 100 can include a barrier layer 300. The electrical component 220 can be positioned between the barrier layer 300 and the substrate 210 (e.g., between the barrier layer 300 and the substrate 210 in the Y-direction). For example, the electrical component 220 can be coupled, directly or indirectly, to the substrate 210, and the barrier layer 300 can be positioned directly on the electrical component 220.

In various examples, the barrier layer 300 encloses the electrical component 220. For example, the substrate 210 and the barrier layer 300 can, collectively, surround the electrical component 220. As will be discussed further, enclosing the electrical component 220 may prevent light, debris, and/or moisture from reaching the electrical component 220. The barrier layer 300 can also enclose the electrical connections 230. For example, the electrical connections 230 can be positioned within the barrier layer 300.

The barrier layer 300 can include a first layer 310 and a second layer 320. The first layer 310 of the barrier layer 300 can be positioned between the electrical component 220 and the second layer 320. For example, the first layer 310 of the barrier layer 300 can be positioned directly between the electrical component 220 and the second layer 320 such that the first layer 310 makes contact with both the electrical component 220 and the second layer 320. In various examples, the second layer 320 encloses the first layer 310.

For example, the substrate 210 and the second layer 320 can, collectively, surround the first layer 310.

The barrier layer 300 can include one or more additional layers, such as a third layer 330. The second layer 320 of the barrier layer 300 can be positioned between the first layer 310 and the third layer 330. For example, the second layer 320 of the barrier layer 300 can be positioned directly between the first layer 310 and the third layer 330 such that the second layer 320 makes contact with both the first layer 310 and the third layer 330. In various examples, the third layer 330 encloses the second layer 320. For example, the substrate 210 and the third layer 330 can, collectively, surround the second layer 320 (e.g., surround in the X-direction, the Y-direction, and the Z-direction).

The first layer 310 can be, or can include, a first epoxy and the second layer 320 can be, or can include, a second epoxy, and the one or more additional layers, such as the third layer 330, can be, or can include, a third epoxy. In various examples, the second epoxy is different than the first epoxy. When a third layer 330 is included, the second epoxy can be different than the third epoxy.

In various examples, the first epoxy includes at least one of a white resin, a black resin, or a clear resin, or a combination thereof. The third epoxy, when a third layer 330 is included, can include at least one of a white resin, a black resin, or a clear resin, or a combination thereof. In various examples, the first epoxy of the first layer is the same as the third epoxy of the third layer.

In various examples, the second epoxy is, or includes, an amber resin. As will be appreciated, the amber resin may block light that includes ultraviolet (UV) light (e.g., ultraviolet A, ultraviolet B, and ultraviolet C light). Blocking light may have various benefits. For example, light, especially UV light, may cause photodegradation and/or photochemical reactions of materials and/or object, which may be undesirable. Therefore, providing the second layer 320, which includes the amber resin, may prevent photodegradation and/or photochemical reactions experienced by the first layer 310 and/or the electrical component 220. In the context of the electrical assembly 200 that is a circuit board, light may also interfere with the performance of certain electrical components 220 of the circuit board. For example, various sensors (e.g., medical sensors, which can include a piezoresistive sensor element, that are configured to monitor and/or measure a blood pressure of a patient) of the circuit board may have reduced performance and become less accurate when exposed to light.

In various examples, sensors of the circuit board may become uncalibrated when exposed to light. For example, sensors of the circuit board may be calibrated when manufactured for a certain light type and light intensity. However, the location as to which the sensor is used, such as a hospital care facility room, may have light types and light intensities that are different than what the sensor was calibrated for. Therefore, providing a second layer 320 that comprises an amber resin may minimize the variance of the type of light and intensity of light that the sensor experiences and may increase the likelihood that the calibration of the sensor will be maintained. Therefore, providing the second layer 320 that includes the amber resin may prevent sensors of the circuit board to have reduced performance, to have reduced accuracy, and to become uncalibrated when used at a location that is different than where it was manufactured and/or calibrated.

As will also be appreciated, amber resins generally have an ultimate tensile strength that is greater than an ultimate tensile strength of resins of other colors and opacities, such as black, white, and clear resins. For example, amber resin that is available as a medical-grade resin (e.g., a resin that is biocompatible and/or manufactured with adherence to ISO 13485 and/or ISO 10993) typically has an ultimate tensile strength that is greater than an ultimate tensile strength of black resin, white resin, or clear resin that is currently available as a medical-grade resin. For example, medical-grade amber resins that are available may have an ultimate tensile strength that is at least 60 megapascal (MPa), such as at least 65 and up to 75 MPa, such as 73 MPa. In contrast, medical-grade black, white, and clear resins that are available may have an ultimate tensile strength that is less than 60 MPa. For example, medical-grade black resin may have a tensile strength that is up to 36 MPa, medical-grade white resin may have a tensile strength that is up to 46 MPa, and medical-grade clear resin may have a tensile strength that is up to 53 MPa. For various applications, such as where the electrical assembly 200 is a circuit board, having a second layer 320 that has an ultimate tensile strength that is greater than 60 MPa may be beneficial and desirable because it adds additional mechanical protection to the circuit board and electrical components 220, such as sensors, that are coupled, directly or indirectly, to the substrate 210 of the circuit board.

When the second layer 320 is, or includes, an amber resin, it may be beneficial to include a first layer 310 that is a black, white, or clear resin that is positioned between the second layer 320 and the electrical assembly 200. For example, generally, resins that are black, white, or clear cost less than a resin that is amber. Therefore, incorporating a first layer 310 that is a black, white, or clear resin may reduce the cost of the electrical device 100.

In various examples, the first epoxy and/or the second epoxy are curable with UV light. Epoxies that are curable with UV light may have a lower viscosity than epoxies that are cured thermally. The lower viscosity may be beneficial. For example, the lower viscosity may allow the epoxy to have better reach, better flow characteristics, and better dispensing properties. The low viscosity may be additionally beneficial for covering intricate designs and/or components that are difficult to reach. For example, when the electrical assembly 200 is a circuit board, the low viscosity may allow the barrier layer 300 to form in the shape of intricate design circuits that are on the circuit board, which allows the barrier layer 300 to better protect the design circuits.

Epoxies that are curable with UV light typically have lower shrinkage than epoxies that are cured thermally. For examples, epoxies that are cured with UV light typically have a shrinkage rate of less than two percent. As such, for certain applications, such as when the electrical assembly 200 is a circuit board, the lower shrinkage rate can prevent damage to the electrical components 220 that is caused by shrinkage of the epoxy.

Epoxies that are curable with UV light typically have higher temperature resistance than epoxies that are cured thermally. As such, epoxies that are curable with UV light can provide greater thermal protection to the electrical assembly 200 than epoxies that are thermally cured.

Referring now to FIG. 2, a flowchart of a method 400 for applying a barrier layer 300 on an electrical assembly 200 is provided, in accordance with an example embodiment. In various examples, the electrical assembly 200 includes an electrical component 220 that is coupled to a substrate 210. The method 400 can include a step 410 of applying a first layer 310 that includes a first epoxy on the electrical assembly 200. For example, the first layer 310 can be poured on the electrical assembly 200. The first layer 310 can be poured on the electrical assembly 200 with a resin dispensing machine. In various examples, the first layer 310 is sprayed on the electrical assembly 200. The first layer 310 can be sprayed on the electrical assembly 200 with a spray gun.

In various examples, multiple layers of the first layer 310 are sprayed on the electrical assembly 200. A thickness of the first layer can be controlled by the number of layers that are sprayed on the electrical assembly 200.

The method 400 can include a step 430 of curing the first layer 310. For example, the first layer 310 can be cured with UV light. As explained, using an epoxy that is curable with UV light has various benefits. However, the first layer 310 may alternatively, or in addition to, be cured thermally. Additionally, or alternatively, the first layer 310 can be cured with a reflow curing technique.

The method 400 can include a step 450 of applying a second layer 320 that includes a second epoxy on the first layer 310. The second epoxy of the second layer 320 can be different than the first epoxy of the first layer 310. In various examples, the second epoxy is an amber resin and the first epoxy is not an amber resin. For example, the second epoxy is an amber resin and the first epoxy is a white resin, a black resin, or a clear resin.

The step 450 of applying the second layer 320 can include spraying the second layer 320 on the first layer 310. One or more layers of the second layer 320 can be applied (e.g., sprayed) on the first layer to control a thickness of the second layer. For example, one or more layers of the second layer 320 can be sprayed until the second layer has a thickness of at least 0.02 millimeter (mm) and up to 0.06 mm. In various examples, the second layer 320 can be applied, such as applied with a spraying technique, which may result in the second layer 320 having a thickness that is less than 0.04 mm, such as less than 0.03 mm.

The method 400 can include a step 470 of curing the second layer 320. For example, the second layer 320 can be cured with UV light. As explained, using an epoxy that is curable with UV light has various benefits. However, the second layer 320 may alternatively, or in addition to, be cured thermally. Additionally, or alternatively, the second layer 320 can be cured with a reflow curing technique.

CONCLUSION

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the appended claims below. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for applying a barrier layer on an electrical assembly, the electrical assembly comprising an electrical component that is coupled to a substrate, wherein the method comprises:

applying a first layer comprising a first epoxy on the electrical assembly; and applying a second layer comprising a second epoxy that is different than the first epoxy on the first layer, wherein the second epoxy comprises an amber resin.

2. The method of claim 1, wherein the method further comprises curing the first layer prior to applying the second layer.

3. The method of claim 2, wherein curing the first layer comprises curing the first layer with ultraviolet (UV) light.

4. The method of claim 1, wherein applying the second layer comprises spraying the second layer on the first layer.

5. The method of claim 4, wherein spraying the second layer on the first layer comprises spraying multiple layers of the second layer on the first layer.

6. The method of claim 4, wherein the second layer has a thickness of at least 0.02 millimeter (mm) and up to 0.06 mm.

7. The method of claim 1, wherein the method further comprises curing the second layer with UV light.

8. The method of claim 7, wherein the second layer has an ultimate tensile strength of at least 55 megapascal (MPa) after the second layer is cured with UV light.

9. The method of claim 1, wherein the first epoxy comprises at least one of a white resin, a black resin, or a clear resin, or a combination thereof.

10. The method of claim 1, wherein the method further comprises enclosing the electrical component with the barrier layer.

11. The method of claim 1, wherein the electrical assembly comprises a plurality of electrical components and a plurality of electrical connections, wherein each of the plurality of electrical connections are configured to allow the flow of electrons between electrical components of the plurality of electrical components, and wherein the method further comprises enclosing the plurality of electrical components and the plurality of electrical connections with the barrier layer.

12. The method of claim 1, further comprising applying a third layer comprising a third epoxy that is different than the second epoxy on the second layer.

13. The method of claim 1, wherein the first epoxy and the second epoxy are both medical-grade epoxies.

14. The method of claim 1, wherein the electrical component is a sensor.

15. The method of claim 1, wherein the electrical assembly is a circuit board.

16. An electrical device comprising:

an electrical assembly comprising:

a substrate; and an electrical component that is coupled to the substrate; and a barrier layer, wherein the electrical component of the electrical assembly is positioned between the substrate and the barrier layer, wherein the barrier layer comprises:

a first layer comprising a first epoxy; and a second layer comprising a second epoxy that is
different than the first epoxy, wherein the first layer
is positioned between the electrical component and
the second layer, and wherein the second epoxy comprises an amber resin.

17. The electrical device of claim 16, wherein the first epoxy comprises at least one of a white resin, a black resin, or a clear resin, or a combination thereof.

18. The electrical device of claim 16, wherein the barrier layer encloses the electrical component.

19. The electrical device of claim 16, wherein the barrier layer comprises a third layer comprising a third epoxy that is different than the second epoxy, wherein the second layer is positioned between the first layer and the third layer.

20. The electrical device of claim 16, wherein the electrical assembly is a circuit board and the electrical component is a sensor.

* * * * *